(12) United States Patent
Yang

(10) Patent No.: US 10,536,175 B1
(45) Date of Patent: Jan. 14, 2020

(54) MULTI-BAND SIGNAL INTEGRATED AMPLIFICATION METHOD, AMPLIFIER AND ANTENNA

(71) Applicant: SHENZHEN ANTOP TECHNOLOGY LIMITED, Shenzhen, Guangdong (CN)

(72) Inventor: Ruidian Yang, Shenzhen (CN)

(73) Assignee: SHENZHEN ANTOP TECHNOLOGY LIMITED, Guangdong (CN)

( * ) Notice: Subject to any disclaimer, the term of this patent is extended or adjusted under 35 U.S.C. 154(b) by 0 days.

(21) Appl. No.: 16/260,383

(22) Filed: Jan. 29, 2019

(30) Foreign Application Priority Data

Jan. 2, 2019 (CN) ..................... 2019 2 0002017 U

(51) Int. Cl.
| | | |
|---|---|---|
| *H04B 1/00* | (2006.01) | |
| *H04B 1/04* | (2006.01) | |
| *H03H 11/34* | (2006.01) | |
| *H04B 1/18* | (2006.01) | |
| *H04B 1/26* | (2006.01) | |
| *H03H 11/28* | (2006.01) | |

(52) U.S. Cl.
CPC ........... *H04B 1/0057* (2013.01); *H03H 11/28* (2013.01); *H03H 11/346* (2013.01); *H04B 1/0078* (2013.01); *H04B 1/0458* (2013.01); *H04B 1/18* (2013.01); *H04B 1/26* (2013.01); *H04B 2001/0416* (2013.01)

(58) Field of Classification Search
CPC .......... H04B 1/0057; H04B 1/26; H04B 1/18; H04B 1/0458; H04B 1/0078; H04B 2001/0416; H03H 11/28; H03H 11/346
See application file for complete search history.

(56) References Cited

U.S. PATENT DOCUMENTS

| | | | | |
|---|---|---|---|---|
| 4,381,566 | A * | 4/1983 | Kane | H01Q 1/36 343/713 |
| 5,212,828 | A * | 5/1993 | Hatashita | H03J 5/244 455/295 |
| 5,890,051 | A * | 3/1999 | Schlang | H03D 7/163 455/76 |
| 2004/0207565 | A1* | 10/2004 | Hibino | H01Q 1/084 343/860 |
| 2005/0264466 | A1* | 12/2005 | Hibino | H01Q 1/242 343/860 |

(Continued)

*Primary Examiner* — Lewis G West
(74) *Attorney, Agent, or Firm* — Pearne & Gordon LLP

(57) ABSTRACT

The present invention relates to a multi-band signal integrated amplification method, an amplifier and an antenna. The method comprises mixing and sending the FM and VHF signals and the UHF signals to the same controllable gain amplifying circuit through an impedance matching circuit and a filtering circuit respectively, and shunt outputting such amplified FM and VHF signals and UHF signals through a signal distributing circuit. The invention ensures that the two sets of signals are transmitted respectively without influencing each other. The two sets of signals sharing one amplifying circuit is beneficial to the reduction of equipment volume and material cost. In addition, it is convenient to adjust the signal to optimal amplification effect, and guarantees the clear restoration of the FM, VHF and UHF signals while maximum reducing the number of amplifiers.

8 Claims, 3 Drawing Sheets

(56) References Cited

U.S. PATENT DOCUMENTS

| | | | |
|---|---|---|---|
| 2010/0073572 A1* | 3/2010 | Burns | H03G 3/3036 348/707 |
| 2010/0309901 A1* | 12/2010 | Beghini | H04B 1/0057 370/343 |
| 2012/0171976 A1* | 7/2012 | Caimi | H04B 1/18 455/193.1 |
| 2014/0307565 A1* | 10/2014 | Samarasooriya | H04B 1/18 370/252 |

* cited by examiner

MULTI-BAND SIGNAL INTEGRATED AMPLIFICATION METHOD, AMPLIFIER AND ANTENNA

TECHNICAL FIELD

The present invention relates to the field of antenna devices, and in particularly to a multi-band signal integrated amplification method, an amplifier and an antenna.

BACKGROUND OF THE INVENTION

A wireless device, such as a cellular phone or a mobile phone, in a wireless communication system can transmit and receive data for two-way communication. The wireless device can include a transmitter for data transmission and a receiver for data reception. For data transmission, the transmitter can use data to modulate a frequency modulation (FM) or a radio frequency (RF) carrier signal to obtain a modulated FM signal or a RF signal, amplify the modulated FM signal or the RF signal to obtain an amplified FM signal or the RF signal with an appropriate output power level, and transmit such amplified FM signal or the RF signal to the base station via an antenna. For data reception, the receiver can obtain the received FM signal or the RF signal via the antenna, and can amplify and process the received FM signal or the RF signal to recover the data transmitted by the base station.

The wireless device can include a plurality of amplifiers, wherein each amplifier is designed to amplify signals of a portion of frequency in a wide frequency range supported by the wireless device. The number of amplifiers is related to the volume and material cost of the wireless device, and it is desirable for developers and users to use fewer amplifiers to support signal amplification over the same wide frequency range. In the prior art, some designs using fewer amplifiers to amplify the RF signal over the wide frequency range may be found, but the same amplifier has never been used to amplify the FM signal and the RF signal over the wide frequency range.

SUMMARY OF THE INVENTION

It is therefore an object of the present invention to provide a multi-band signal integrated amplification method capable of restoring the RF signal and the FM signal clearly, a multi-band signal integrated amplifier using the method, and an antenna using the amplification method or the amplifier.

According to the present invention, a multi-band signal integrated amplification method, in which the signal at least includes a set of FM and VHF signals and a set of UHF signals, comprises mixing and sending the FM and VHF signals and the UHF signals to the same controllable gain amplifying circuit through an impedance matching circuit and a filtering circuit respectively, and shunt outputting such amplified signals through a signal distributing circuit.

The FM and VHF signals and the UHF signals are mixed and sent to the same amplifying circuit through an impedance matching circuit and a filtering circuit respectively, so that the two sets of signals are transmitted respectively without influencing each other. The two sets of signals sharing one amplifying circuit is beneficial to the reduction of equipment volume and material cost. The use of the controllable gain amplifying circuit is convenient for the user to adjust the signal to optimal amplification effect within a certain range, and guarantees the clear restoration of the FM, VHF and UHF signals while maximum reducing the number of amplifiers. The amplified FM signal and the RF (i.e. VHF and UHF) signal are distributed through the signal distributing circuit as two RF outputs, in which one output (VHF/UHF signal) can be connected to a TV, and the other output (FM/VHF/UHF signal) can be connected to the TV or a radio, or both two outputs (FM/VHF/UHF signal) can be connected to the TV or the radio to allow the use of two devices simultaneously.

With the popularization of the signals in ultra-high frequency bands (such as 4G frequency band) and the expansion of coverage range and the enhancement of intensity of the signals in ultra-high frequency bands, the FM and VHF signals and the UHF signals are sequentially shunt output through an ultra-high band filter and a signal distributing circuit after being mixed and sent to the same amplifying circuit, in order to avoid the influence of high-frequency signals on the FM signals and the RF signals. The FM and VHF signals and the UHF signals will filter out a mobile phone signal in the 4G frequency band or higher frequency band through the ultra-high frequency band filter, so that the mobile phone signal cannot interfere with the reception of a TV/FM signal.

Another object of the present invention is to provide a multi-band signal integration amplifier, which comprises a first signal processing circuit, a second signal processing circuit, an amplifying circuit, a signal distributing circuit, a gain control circuit and a power supply.

The first signal processing circuit includes a first signal input terminal, a first matching isolation circuit and a low-pass filtering circuit, which are sequentially connected, wherein the first signal input terminal is used to input the FM and VHF signals, the first matching isolation circuit is used for impedance matching and isolation of the FM and VHF signals, and the low-pass filtering circuit is used to filter the FM and VHF signals.

The second signal processing circuit includes a second signal input terminal, a second matching isolation circuit and a high-pass filtering circuit, which are sequentially connected, wherein the second signal input terminal is used to input the UHF signals, the second matching isolation circuit is used for impedance matching and isolation of the UHF signals, and the high-pass filtering circuit is used to filter the UHF signals.

The amplifying circuit, which is used for amplifying the FM and VHF signals and the UHF signals, has an amplifying circuit input and an amplifying circuit output, wherein the low-pass filtering circuit and the high-pass filtering circuit are connected to the amplifying circuit input.

The signal distributing circuit, which is connected to the amplifying circuit output and is used for shunt outputting the amplified signal, has a first signal output terminal for outputting an FM/VHF/UHF signal and a second signal output terminal for outputting an FM/VHF/UHF signal or a VHF/UHF One end of the gain control circuit is connected to the signal distributing circuit for adjusting the gain.

The power supply, which is connected to the amplifying circuit output and the other end of the gain control circuit, is designed to supply power to the amplifying circuit and the gain control circuit.

In the first signal processing circuit, the FM and VHF signals are performed impedance matching and clutter filtering through the first matching isolation circuit after being input from the first signal input terminal, and then the preliminary modulation processing of the FM and VHF signals is completed through filtering out the high-frequency signal by the low-pass filtering circuit. In the second signal processing circuit, the UHF signals are performed impedance matching and clutter filtering through the second matching isolation circuit after being input from the second signal input terminal, and then the preliminary modulation processing of the UHF signals is completed through filtering out the low-frequency signal by the high-pass filtering circuit. The FM and VHF signals and the UHF signals are mixed into the amplifying circuit after being preliminarily modulated by the first signal processing circuit respectively, and the second signal processing circuit, and are shunt output by the signal distributing circuit as clearly restored FM/VHF/UHF signal after being amplified by the amplifying circuit.

The gain control circuit and the power supply, which supplies power to the amplifying circuit and the gain control circuit, are connected to the amplifying circuit and the signal distributing circuit therebetween, so that the user can adjust the amplifier signal to optimal amplification effect according to actual needs, thereby ensuring better restoration of the needed signal.

The amplifying circuit is preferably an amplifying IC with low noise coefficient to further improve the restoring definition of a radio frequency television program and FM sound quality.

The high-intensity signal input will influence the service life of the amplifying circuit to some degree. To protect the amplifying circuit, the present invention further includes a forward signal protection circuit connected to the amplifying circuit input and a reverse signal protection circuit connected to the amplifying circuit output. More specifically, the forward signal protection circuit and the reverse signal protection circuit are both composed of two anti-parallel diodes grounded at one end.

The gain control circuit includes a gain adjustment portion and a gain matching portion, which are connected to each other, wherein the gain adjustment portion is connected to the power supply, and the gain matching portion is connected to the signal distributing circuit.

The gain matching portion contains at least one diode or at least one diode and a plurality of resistors connected in series or parallel, which can not only perform the gain matching function, but also prevent the ultra-high frequency band signals, such as 4G signals, from entering the amplifier from the output to interfere with the amplification processing and output of the FM and VHF signals and the UHF signals, which will ultimately affect the program effect and sound quality effect.

With the popularization of signals in ultra-high frequency bands, such as 4G frequency band, and the expansion of coverage range and the enhancement of intensity of the signals in ultra-high frequency bands, the amplifier also includes the ultra-high band filter for filtering out the 4G signal in order to avoid the influence of high-frequency signals on the FM signals and the RF signals, and the gain adjustment portion and the gain matching portion are connected by the ultra-high band filter. The FM and VHF signals and the UHF signals filter out the mobile phone signal in the 4G frequency band or higher frequency band through the ultra-high frequency band filter, so that the mobile phone signal cannot interfere with the reception of the TV/FM signal.

The present invention farther provides an antenna applied to the above multi-band signal integrated amplification method or the amplifier. The antenna comprises a set of first vibrator transmitting or receiving the FM and VHF signals and a set of second vibrator transmitting or receiving the UHF signals. The first vibrator has a first connecting terminal connected to the first signal input terminal or the first signal output terminal, and the second vibrator has a second connecting terminal connected to the second signal input terminal or the second signal output terminal.

The invention adopts the first vibrator to transmit or receive the FM and VHF signals, that is, the FM and VHF vibrators are designed into one vibrator structure, thereby reducing the cost under the premise of ensuring a certain receiving effect. In addition, the amplification method or the amplifier according to the invention greatly improves the transmitting or receiving effect of signals. The first vibrator and the second vibrator can be arranged on the same non-metallic substrate to facilitate batch assembly; the first vibrator and the second vibrator can also be made from metal sheets respectively to reduce material cost; and the first vibrator and the second vibrator can be arranged on different non-metallic substrates respectively. The present invention prefers the first option.

More specifically, the first vibrator includes a first left vibrator bar and a first right vibrator bar, which have openings in C-shaped form arranged opposite to each other. The first left vibrator bar includes an upper left side, a left side, and a lower left side which are sequentially connected. The first right vibrator bar includes an upper right side, a right side, and a lower right side which are sequentially connected. One end of the lower left side facing away from the left side is connected with a first left lead wire having a first connecting terminal, and one end of the lower right side facing away from the right side is connected with a first right lead wire having a first connecting terminal. The second vibrator includes a second left vibrator bar and a second right vibrator bar which are arranged in a line and both have a linear structure. The opposite ends of the second left vibrator bar and the second right vibrator bar are respectively connected to a second left lead wire and a second right lead wire which have a second connecting terminal.

In order to better transmit or receive signals, the total length of the first left vibrator bar is different from the total length of the first right vibrator bar, and the total length of the second left vibrator bar is different from the total length of the second right vibrator bar.

The first vibrator and the second vibrator are arranged on the same non-metallic substrate in order to facilitate batch assembly. The sum of the lengths of the upper left side, the upper right side, the second left vibrator bar and the second right vibrator bar is smaller than the sum of the lengths of the lower left side and the lower right side. The second left vibrator bar and the second right vibrator bar are arranged between the upper left side and the upper right side and are arranged along the same line with the upper left side and the upper right side, i.e., the second left vibrator bar, the second right vibrator bar, the upper left side and the upper right side are on the same line. The first left lead and the second right lead are arranged along the same line, and the first right lead and the second right lead are arranged along the same line in order to facilitate wiring.

Compared with the prior art, some beneficial effects of the present invention can be obtained. The FM and VHF signals and the UHF signals are mixed and sent to the same amplifying circuit through the impedance matching circuit and the filtering circuit respectively, thus the two sets of signals are transmitted respectively without influencing each other. The two sets of signals sharing one amplifying circuit is beneficial to the reduction of equipment volume and material cost. In addition, the configuration of the controllable gain amplifying circuit is convenient for the user to adjust the signal to optimal amplification effect within a certain range, and guarantees the clear restoration of the FM, VHF and UHF signals while maximum reducing the number of amplifiers. The amplified FM signals and the RF (i.e. VHF and UHF) signals are distributed through the signal distributing circuit as two RF outputs in which one output (UHF signal) can be connected to the TV, and the other output (FM and VHF signal) can be connected to the TV or the radio to bring convenience for the user. The amplifying circuit is preferably an amplifying IC with low noise coefficient, which can further improve the restoring definition of the radio frequency television program and FM sound quality. Further, the FM and VHF signals and the UHF signals will filter out the mobile phone signal in the 4G frequency band or higher frequency band through the ultra-high frequency band filter, so that the mobile phone signal cannot interfere with the reception of the TV/FM signal.

DESCRIPTION OF EMBODIMENTS

Figure 1:
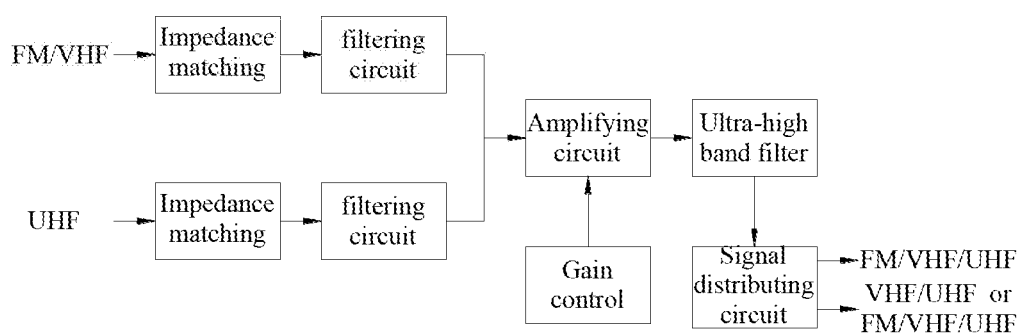
FIG. 1 is a schematic diagram of an embodiment of an amplification method.

The drawings of the present invention are for illustration purpose only and are not intended to limit the present invention. Some components in the drawings are omitted, enlarged or reduced for better illustrating the embodiments, and sizes of these components do not represent sizes of actual product. For those skilled in the art, it will be understood that some known structures in the drawings and descriptions thereof are omitted. The description of positional relationship in the drawings is for illustration purpose only and is not intended to limit the present invention. The present invention will be further illustrated below with reference to specific embodiments.

Embodiment of an Amplification Method

As shown in FIG. 1, a multi-band signal integrated amplification method, in which the signal at least includes a set of FM and VHF signals and a set of UHF signals, comprises mixing and sending the FM and VHF signals and the UHF signals to the same controllable gain amplifying circuit through an impedance matching circuit and a filtering circuit respectively, and shunt outputting such amplified signals through a signal distributing circuit.

The FM and VHF signals and the UHF signals are mixed and sent to the same amplifying circuit through an impedance matching circuit and a filtering circuit respectively, so that the two sets of signals are transmitted respectively without influencing each other. The two sets of signals sharing one amplifying circuit is beneficial to the reduction of equipment volume and material cost. The use of the controllable gain amplifying circuit is convenient for the user to adjust the signal to optimal amplification effect within a certain range, and guarantees the clear restoration of the FM, VHF and UHF signals while maximum reducing the number of amplifiers. The amplified FM signals and the RF (i.e. VHF and UHF) signals are distributed through the signal distributing circuit as two RF outputs, in which one output (VHF/UHF signal) can be connected to the TV, and the other output (FM/VHF/UHF signal) can be connected to the TV or the radio, or both two outputs (FM/VHF/UHF signal) can be connected to the TV or the radio to allow the use of two devices simultaneously.

With the popularization of signals in ultra-high frequency bands, such as 4G frequency band, and the expansion of coverage range and the enhancement of intensity of the signals in ultra-high frequency bands, in order to avoid the influence of high-frequency signals on the FM signals and the RF signals, the FM and VHF signals and the UHF signals are sequentially shunt output through a ultra-high band filter and a signal distributing circuit after being mixed and sent to the same amplifying circuit. The FM and VHF signals and the UHF signals will filter out the mobile phone signal in the 4G frequency band or higher frequency band through the ultra-high frequency band filter, so that the mobile phone signal cannot interfere with the reception of the TV/FM signal.

Embodiment of an Amplifier

Figure 2:
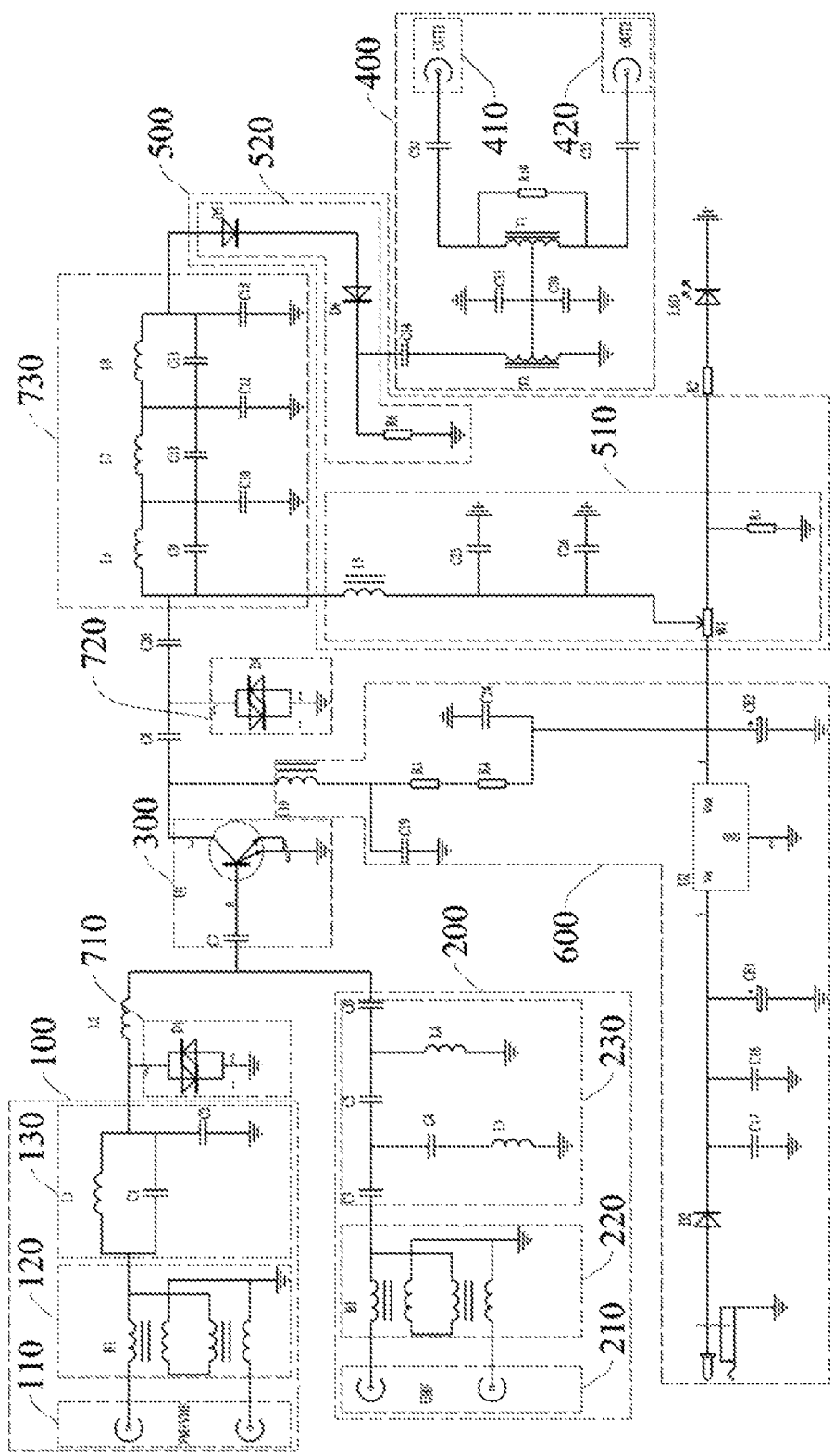
FIG. 2 is a circuit diagram of an embodiment of an amplifier.

As shown in FIG. 2, a multi-band signal integration amplifier according to the present embodiment comprises a first signal processing circuit 100, a second signal processing circuit 200, an amplifying circuit 300, a signal distributing circuit 400, a gain control circuit 500 and a power supply 600.

The first signal processing circuit 100 includes a first signal input terminal 110, a first matching isolation circuit 120 and a low-pass filtering circuit 130, which are sequentially connected, wherein the first signal input terminal 110 is used to input the FM and VHF signals, the first matching isolation circuit 120 is used for impedance matching and isolation of the FM and VHF signals, and the low-pass filtering circuit 130 is used to filter the FM and VHF signals.

The second signal processing circuit 200 includes a second signal input terminal 210, a second matching isolation circuit 220 and a high-pass filtering circuit 230, which are sequentially connected, wherein the second signal input terminal 210 is used to input the UHF signals, the second matching isolation circuit 220 is used for impedance matching and isolation of the UHF signals and the high-pass filtering circuit 230 is used to filter the UHF signals.

The amplifying circuit 300, which is used for amplifying the FM and VHF signals and the UHF signals, has an amplifying circuit input 300 and an amplifying circuit output, wherein the low-pass filtering circuit 130 and the high-pass filtering circuit 230 are connected to the amplifying circuit input.

The signal distributing circuit 400, which is connected to the amplifying circuit output, and is used for shunt outputting the amplified signal, has a first signal output terminal 410 for outputting an FM/VHF/UHF signal and a second signal output terminal 420 for outputting an FM/VHF/UHF signal or a VHF/UHF signal.

An end of the gain control circuit 500 is connected to the signal distributing circuit 400 for adjusting the gain.

The power supply 600, which is connected to the amplifying circuit output and the other end of the gain control circuit 500, is designed to supply power to the amplifying circuit 300 and the gain control circuit 500.

In the first signal processing circuit 100, the FM and VHF signals are performed impedance matching and clutter filtering through the first matching isolation circuit 120 after being input from the first signal input terminal 110, and then the preliminary modulation processing of the FM and VHF signals is completed through filtering out the high-frequency signal by the low-pass filtering circuit 130. In the second signal processing circuit 200, the UHF signal are performed impedance matching and clutter filtering through the second matching isolation circuit 220 after being input from the second signal input terminal 210, and then the preliminary modulation processing of the UHF signals is completed through filtering out the low-frequency signal by the high-pass filtering circuit 230. The FM and VHF signals and the UHF signals are mixed into the amplifying circuit 300 after being preliminarily modulated by the first signal processing circuit 100 and the second signal processing circuit 200 respectively, and are shunt output by the signal distributing circuit 400 as clearly restored FM/VHF/UHF signal after being amplified by the amplifying circuit 300.

The gain control circuit 500 and the power supply 600, which supplies power to the amplifying circuit 300 and the gain control circuit 500, are connected to the amplifying circuit 300 and the signal distributing circuit 400 therebetween, so that the user can adjust the amplifier signal to optimal amplification effect according to actual needs, thereby ensuring better restoration of the needed signal.

The amplifying circuit 300 is preferably an amplifying IC with low noise coefficient to further improve the restoring definition of the radio frequency television program and FM sound quality.

The high-intensity signal input will influence the service life of the amplifying circuit 300 to some degree. To protect the amplifying circuit 300, the present embodiment further includes a forward signal protection circuit 710 connected to the amplifying circuit input and a reverse signal protection circuit 720 connected to the amplifying circuit output. More specifically, the forward signal protection circuit 710 and the reverse signal protection circuit 720 are both composed of two anti-parallel diodes grounded at one end.

The gain control circuit 500 includes a gain adjustment portion 510 and a gain matching portion 520, which are connected to each other, wherein the gain adjustment portion 510 is connected to the power supply 600, and the gain matching portion 520 is connected to the signal distributing circuit 400.

The gain matching portion 520 contains at least one diode or at least one diode and a plurality of resistors connected in series or parallel, which can not only perform the gain matching function, but also prevent the ultra-high frequency band signals, such as 4G signals, from entering the amplifier from the output to interfere with the amplification processing and output of the FM and VHF signals and the UHF signals, which will ultimately affect the program effect and sound quality effect.

With the popularization of signals in ultra-high frequency bands, such as 4G frequency band, and the expansion of coverage range and the enhancement of intensity of the signals in ultra-high frequency bands, in order to avoid the influence of high-frequency signals on the FM signals and the RF signals, the amplifier also includes an ultra-high band filter 730 for filtering out the 4G signal, and the gain adjustment portion 510 and the gain matching portion 520 are connected by the ultra-high band filter 730. The FM and VHF signals and the UHF signals filter out the mobile phone signal in the 4G frequency band or higher frequency band through the ultra-high frequency band filter 730, so that the mobile phone signal cannot interfere with the reception of the TV/FM signal.

Embodiment of an Antenna

Figure 3:
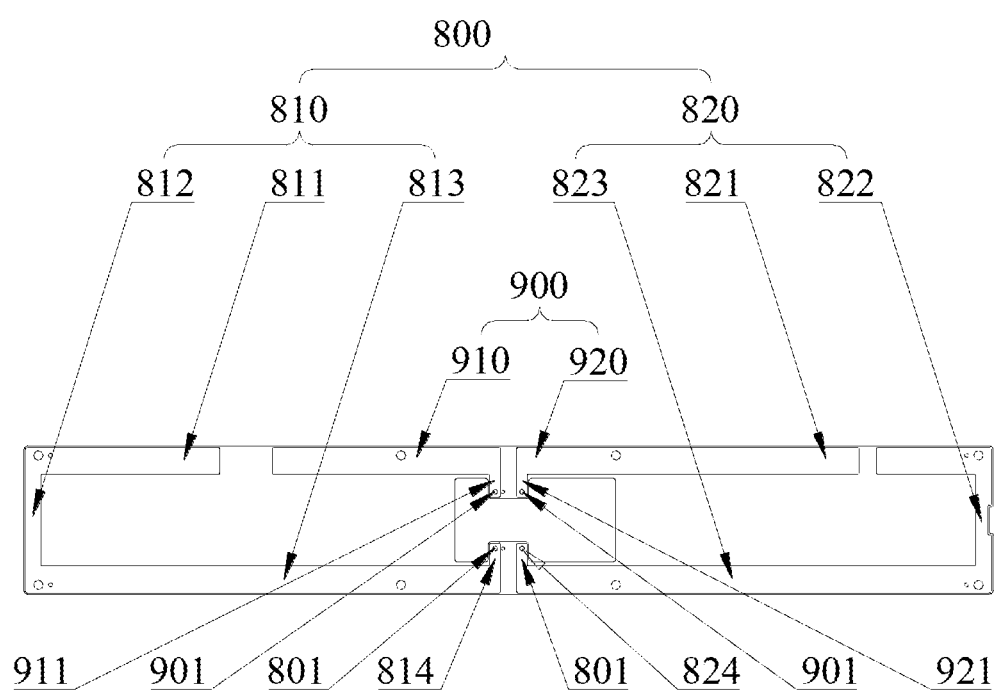
FIG. 3 is a schematic structural view of a first vibrator and a second vibrator according to an embodiment of an antenna.

As shown in FIG. 3, an antenna applied to the above multi-band signal integrated amplification method or the amplifier, comprising a set of first vibrator 800 transmitting or receiving the FM and VHF signals and a set of second vibrator 900 transmitting or receiving the UHF signals. The first vibrator 800 has a first connecting terminal 801 connected to the first signal input terminal 110 or the first signal output terminal 410, and the second vibrator 900 has a second connecting terminal 901 connected to the second signal input terminal 210 or the second signal output terminal 420.

The invention adopts the first vibrator 800 to transmit or receive the FM and VHF signals, that is, the FM and VHF vibrators are designed into one vibrator structure, thereby reducing the cost under the premise of ensuring a certain receiving effect. In addition, the amplification method or the amplifier according to the above embodiments greatly improves the transmitting or receiving effect of signals. The first vibrator 800 and the second vibrator 900 can be arranged on the same non-metallic substrate to facilitate batch assembly; the first vibrator 800 and the second vibrator 900 can also be made from metal sheets respectively to reduce material cost; or the first vibrator 800 and the second vibrator 900 can be arranged on different non-metallic substrates respectively. The present invention prefers the first option.

More specifically, the first vibrator 800 includes a first left vibrator bar 810 and a first right vibrator bar 820, which have openings in C-shaped form arranged opposite to each other. The first left vibrator bar 810 includes an upper left side 811, a left side 812, and lower left side 813 which are sequentially connected. The first right vibrator bar 820 includes an upper right side 821, a right side 822, and a lower right side 823 which are sequentially connected. One end of the lower left side 813 facing away from the left side 812 is connected with a first left lead wire 814 having a first connecting terminal 801, and one end of the lower right side 823 facing away from the right side 822 is connected with a first right lead wire 824 having a first connecting terminal 801. The second vibrator 900 includes a second left vibrator bar 910 and a second right vibrator bar 920, which are arranged in a line and both have a linear structure. The opposite ends of the second left vibrator bar 910 and the second right vibrator bar 920 are respectively connected to a second left lead wire 911 and a second right lead wire 921 which both have t second connecting terminal 901.

In order to better transmit or receive signals, the total length of the first left vibrator bar 810 is different from the total length of the first right vibrator bar 820, and the total length of the second left vibrator bar 910 is different from the total length of the second right vibrator bar 920.

In order to facilitate batch assembly, the first vibrator 800 and the second vibrator 900 are arranged on the same non-metallic substrate. The sum of the lengths of the upper left side 811, the upper right side 821, the second left vibrator bar 910 and the second right Vibrator bar 920 is smaller than the sum of the lengths of the lower left side 813 and the lower right side 823. The second left vibrator bar 910 and the second right vibrator bar 920 are arranged between the upper left side 811 and the upper right side 821 and are arranged along the same line with the upper left side 811 and the upper right side 821, i.e., the second left vibrator bar 910, the second right vibrator bar 920, the upper left side 811 and the upper right side 821 are on the same line. In order to facilitate wire connection, the first left lead wire 814 and the second right lead wire 921 are arranged along the same line, and the first right lead wire 824 and the second right lead wire 921 are arranged along the same line.

Obviously, the above embodiments of the present invention are merely examples for clear illustration, and are not intended to limit the implementations of the present invention. Modifications or changes can be made by those ordinary skilled in the art on the basis of the above description. There is neither need nor exhaustion for all implementations. Any modification, equivalent substitution, improvement, or the like within the spirit and principle of the invention should be included in the scope of the claims of the invention.

The invention claimed is:

1. A multi-band signal integration amplifier, comprising:
 a first signal processing circuit including
  a first signal input terminal used to input an FM and VHF signal,
  a first matching isolation circuit used for impedance matching and isolation of the FM and VHF signal, and
  a low-pass filtering circuit used to filter the FM and VHF signal,
  wherein the first signal input terminal, the first matching isolation circuit and the low-pass filtering circuit are sequentially connected;
 a second signal processing circuit including
  a second signal input terminal used to input a UHF signal,
  a second matching isolation circuit used for impedance matching and isolation of the UHF signal, and
  a high-pass filtering circuit used to filter the UHF signal,
  wherein the second signal input terminal, the second matching isolation circuit and the high-pass filtering circuit are sequentially connected;
 an amplifying circuit used for amplifying the FM and VHF signal and the UHF signal, including
  an amplifying circuit input, and
  an amplifying circuit output,
  wherein the low-pass filtering circuit and the high-pass filtering circuit are connected to the amplifying circuit input;
 a signal distributing circuit connected to the amplifying circuit output for shunt outputting an amplified signal, including
  a first signal output terminal for outputting an FM/VHF/UHF signal, and
  a second signal output terminal for outputting the FM/VHF/UHF signal or a VHF/UHF signal;
 a gain control circuit, with an end connected to the signal distributing circuit for adjusting the gain; and
 a power supply, which is connected to the amplifying circuit output and the other end of the gain control circuit and is designed to supply power to the amplifying circuit and the gain control circuit.

2. The amplifier according to claim 1, in order to protect the amplifying circuit, further comprising
 a forward signal protection circuit connected to the amplifying circuit input, and
 a reverse signal protection circuit connected to the amplifying circuit output.

3. The amplifier according to claim 2, wherein the forward signal protection circuit and the reverse signal protection circuit are both composed of two anti-parallel diodes grounded at one end.

4. The amplifier according to claim 1,
 wherein the gain control circuit includes
  a gain adjustment portion connected to the power supply, and
  a gain matching portion connected to the signal distributing circuit,
  wherein the gain adjustment portion and the gain matching portion are connected to each other.

5. The amplifier according to claim 4, wherein the gain matching portion contains at least one diode or at least one diode and a plurality of resistors connected in series or parallel.

6. An antenna applied to the amplifier according to claim 1, comprising
 a set of first vibrator for transmitting or receiving the FM and VHF signal, containing a first connecting terminal connected to the first signal input terminal or the first signal output terminal, and
 a set of second vibrator for transmitting or receiving the UHF signal, containing a second connecting terminal connected to the second signal input terminal or the second signal output terminal.

7. The antenna according to claim 6,
 wherein the first vibrator includes
  a first left vibrator bar including an upper left side, a left side, and a lower left side, which are sequentially connected, and
  a first right vibrator bar including an upper right side, a right side, and a lower right side, which are sequentially connected,
  wherein the first left vibrator bar and the first right vibrator bar have openings in C-shaped form disposed opposite to each other,
  wherein one end of the lower left side facing away from the left side is connected with a first left lead wire having a first connecting terminal, and one end of the lower right side facing away from the right side is connected with a first right lead wire having a first connecting terminal, and
 wherein the second vibrator includes
  a second left vibrator bar and a second right vibrator bar which are arranged in a line and both have a linear stricture,
  wherein the opposite ends of the second left vibrator bar and the second right vibrator bar are respectively connected to a second left lead wire and a second right lead wire which both have the connecting second terminal.

8. The amplifier according to claim 4, further comprising an ultra-high frequency band filter for filtering out the 4G signal,
 wherein the gain adjustment portion and the gain matching portion are connected by the ultra-high frequency band filter.

* * * * *